United States Patent
Honda et al.

(10) Patent No.: US 7,686,623 B2
(45) Date of Patent: Mar. 30, 2010

(54) ELECTRONIC DEVICE INCLUDING PRINTED CIRCUIT BOARD, CONNECTOR AND CASE

(75) Inventors: Takayoshi Honda, Nagoya (JP); Dai Ito, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/222,556

(22) Filed: Aug. 12, 2008

(65) Prior Publication Data

US 2009/0075501 A1    Mar. 19, 2009

(30) Foreign Application Priority Data

Sep. 18, 2007   (JP)   ............... 2007-241481

(51) Int. Cl.
*H01R 12/00*   (2006.01)

(52) U.S. Cl. ........................................ 439/78

(58) Field of Classification Search ............ 439/74, 439/78, 66, 76.1, 79, 80, 83, 573

See application file for complete search history.

(56) References Cited

U.S. PATENT DOCUMENTS

| | | | | |
|---|---|---|---|---|
| 5,647,749 | A | * | 7/1997 | Atoh et al. ............ 439/79 |
| 5,772,452 | A | * | 6/1998 | Aoyama ................ 439/74 |
| 7,144,258 | B2 | | 12/2006 | Ariga et al. |
| 7,367,818 | B2 | * | 5/2008 | Sakamoto ............. 439/79 |
| 2008/0144260 | A1 | | 6/2008 | Honda |
| 2008/0146051 | A1 | | 6/2008 | Honda |

FOREIGN PATENT DOCUMENTS

| | | |
|---|---|---|
| JP | 03-041797 A | 2/1991 |
| JP | 2003-133749 A | 5/2003 |
| JP | 2005-160207 A | 6/2005 |
| JP | 3769460 B2 | 2/2006 |

OTHER PUBLICATIONS

Office Action issued from the Japanese Patent Office in the corresponding JP application No. 2007-241481 dated Sep. 8, 2009 (English translation enclosed).

* cited by examiner

*Primary Examiner*—Edwin A. Leon
(74) *Attorney, Agent, or Firm*—Posz Law Group, PLC

(57) ABSTRACT

An electronic device includes a printed circuit board, a connector mounted on the printed circuit board, and a case housing the printed circuit board. The connector includes a housing and a plurality of terminals arranged in the housing. The case has an opening portion on one side thereof and the housing covers the opening portion. The case includes a wall having a case-side fixing part and a case-side engaging part at a portion adjacent to the opening portion. The housing has a housing-side fixing part and a housing-side engaging part. The case-side fixing part engages with the housing-side fixing part for fixing the housing to the case. The case-side engaging part engages with the housing-side engaging part for restricting the portion of the case adjacent to the opening portion from separating from the housing.

28 Claims, 8 Drawing Sheets

ELECTRONIC DEVICE INCLUDING PRINTED CIRCUIT BOARD, CONNECTOR AND CASE

CROSS REFERENCE TO RELATED APPLICATIONS

The present application is based on and claims priority to Japanese Patent Application No. 2007-241481 filed on Sep. 18, 2007, the contents of which are incorporated in their entirety herein by reference.

BACKGROUND OF THE INVENTION

1. Field of the Invention

The present invention relates to an electronic device including a printed circuit board, a connector mounted on the printed circuit board, and a casing housing the printed circuit board therein.

2. Description of the Related Art

In a conventional electronic device, a printed circuit board is housed in a case having an opening portion, and a housing of a connector mounted on the printed circuit board covers the opening portion of the case.

For example, in an electronic control device disclosed in JP-A-2005-160207, a case has an approximately rectangular box shape and has an opening portion at one sidewall. Each of two sidewalls located on opposite sides of the one sidewall has a fixing hole. A connector has two fixing projections each engaging with corresponding one of the fixing holes. Thereby, a unit body including the connector is fixed to the case. Furthermore, the one sidewall having the opening portion has engaging ribs protruding to an outside of the case and the connector has engaging grooves. Each of the engaging ribs is lifted into corresponding one of the engaging grooves. Thereby, the two sidewalls are restricted from opening toward the outside of the case. As a result, the engagements of the fixing holes and the fixing projections are restricted from being released.

In the present electronic device, center portions of the two sidewalls in a longitudinal direction of the two sidewalls may warp toward the outside of the case due to a change in a temperature. The engaging ribs and the engaging projections are difficult to restrict the warps of the two sidewalls. Thus, the engagements of the fixing holes and the fixing projections are possibly released.

In an electronic device disclosed in Japanese Patent No. 3,769,460, a case has an approximately rectangular box shape and one side of the case opens to provide an opening portion. The case has first fixing parts (holes) adjacent to the opening portion. A housing of a connector has second fixing parts (projections) adjacent to the opening portion. The opening portion is covered with the housing in a state where each of the second fixing parts engages with corresponding one of the first engaging parts. The opening portion is deformed to have an arcuate shape before the housing is inserted therein. By inserting the housing into the opening portion, the shape of the opening portion is adjusted so as to strengthen the engagements of the first fixing parts and the second fixing parts.

In the present electronic device, the shape of the opening portion may be deformed and/or sidewalls may warp due to a change in the temperature. Thus, the engagements of the first engaging parts and the second engaging parts are possibly released due to the deformation of the opening portion or the warps of the sidewalls.

SUMMARY OF THE INVENTION

In view of the foregoing problems, it is an object of the present invention to provide an electronic device that includes a case and a connector fixed to each other with a high degree of certainty.

According to a first aspect of the invention, an electronic device includes a printed circuit board, a case, and a connector. The printed circuit board has an electronic element and a plurality of lands. The case has an approximately rectangular tubular shape and one end of the approximately rectangular tubular shape opens to provide an opening portion from which the printed circuit board is inserted into the case. The connector includes a housing and a plurality of terminals arranged in the housing. The housing covers the opening portion of the case and defines an inner space. Each of the plurality of terminals has two end portions. One end portion of the each of the plurality of terminals extends from the housing and is coupled with corresponding one of the plurality of lands. The other end portion of the each of the plurality of terminals extends from the housing toward the inner space. The case includes a wall having a case-side fixing part and a case-side engaging part at a portion adjacent to the opening portion. The housing has a housing-side fixing part and a housing-side engaging part at a surface facing the wall of the case. The case-side fixing part is one of a fixing projection and a fixing hole and the housing-side fixing part is the other one of the fixing projection and the fixing hole. The case-side fixing part engages with the housing-side fixing part for fixing the case and the housing to each other. The case-side engaging part is one of an engaging projection and an engaged section and the housing-side engaging part is the other one of the engaging projection and the engaged section. The case-side engaging part engages with the housing-side engaging part for restricting the portion of the case adjacent to the opening portion from separating from the housing.

In the present electronic device, the case and the connector can be fixed to each other at a high degree of certainty due to the engagement of the case-side engaging part and the housing-side engaging part in addition to the engagement of the case-side fixing part and the housing-side fixing part.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 9 is a plan view illustrating the connector viewed from a side where an external connector is fitted with;

FIG. 10 is a plan view illustrating the connector viewed from a side where a printed circuit board is coupled to;

DETAILED DESCRIPTION OF THE PREFERRED EMBODIMENTS

First Embodiment

Figure 1:
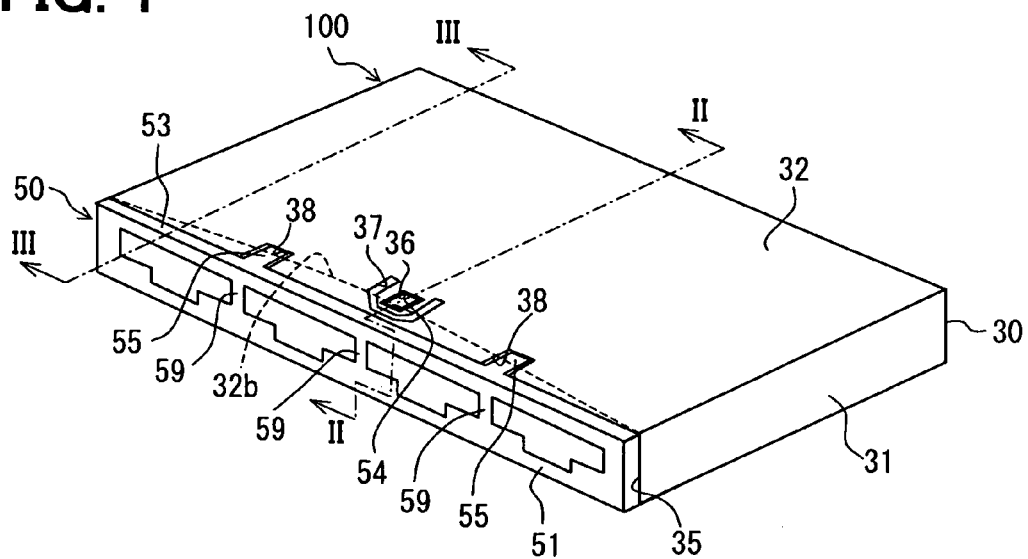
FIG. 1 is a perspective view illustrating an electronic control device according to a first embodiment of the invention.

An electronic control device 100 according to a first embodiment of the invention will be described with reference to FIG. 1-FIG. 13. The electronic control device 100 has a non-waterproof structure and can be suitably used for an electronic control device disposed in a vehicle, for example, for an engine electronic control unit (engine ECU).

The electronic control device 100 includes a printed circuit board 10, a case 30, and a connector 50. The case 30 houses the printed circuit board 10 therein. The case 30 has an opening portion 34 on one side thereof. The connector 50 is mounted on the printed circuit board 10 and covers the opening portion 34 of the case 30.

The printed circuit board 10 has an approximately rectangular plate shape. The printed circuit board 10 has wirings and via holes for coupling the wirings. The wirings include lands functioning as electrodes. On the printed circuit board 10, electronic elements (not shown) including a microcomputer, a power transistor, a resistor, and a capacitor are mounted. The connector 50 is mounted on the printed circuit board 10 as one of the electronic elements. The connector 50 is configured to electrically couple the printed circuit board 10 and an external connector. The connector 50 includes a housing 51 and a plurality of terminals 52. Each of the terminals 52 are coupled with corresponding one of the lands through a solder. The printed circuit board 10 may be made of thermoplastic resin, thermosetting resin, ceramics, or a complex of glass (e.g., glass fabric) and resin, for example. The number of layer of the printed circuit board 10 is not limited.

Figure 4:
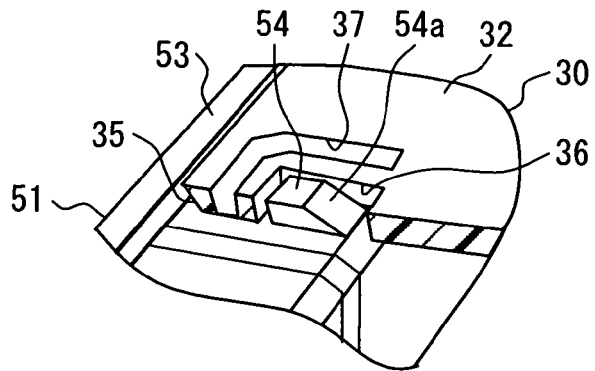
FIG. 4 is a perspective view illustrating a fixing hole, a fixing projection, and a spring groove.

The case 30 houses the printed circuit board 10 therein. The case 30 may be made of aluminum die casting, press working, or resin molding, for example. The case 30 has an approximately rectangular box shape defined by an upper wall 32, a lower wall 33 facing the upper wall 32, and three sidewalls 31 located between the upper wall 32 and the lower wall 33. Each of the upper wall 32 and the lower wall 33 is larger than each of the sidewalls 31. The upper wall 32, the lower wall 33 and two of the sidewalls 31 define the opening portion 34 on an opposite side of the other one of the sidewall 31. Now, the sidewall 31 located on an opposite side of the opening portion 34 is called a rear wall 31a. The printed circuit board 10 is inserted into the case 30 from the opening portion 34 toward the rear wall 31a. As illustrated in FIG. 4, an open edge 35 of the case 30 that defines the opening portion 34 has a taper shape so that the printed circuit board 10 can be easily inserted into the case 30.

The case 30 has at least one case-side fixing part at a portion adjacent to the opening portion 34. That is, at least one of the upper wall 32, the lower wall 33, and the two sidewalls 31 adjacent to the opening portion 34 has the case-side fixing part at the portion adjacent to the opening portion 34. The case-side fixing part engages with a housing-side fixing part formed at the housing 51 so that the case 30 and the housing 51 are fixed to each other in a direction approximately perpendicular to an engaging direction of the fixing parts. In the present embodiment, each of the upper wall 32 and the lower wall 33 has a fixing hole 36 at a middle portion in a longitudinal direction of the housing 51 as an example of the case-side fixing part. Each of the fixing holes 36 has an approximately rectangular cross-sectional shape. In addition, each of the upper wall 32 and the lower wall 33 has a spring groove 37 adjacent to corresponding one of the fixing holes 36. Each of the spring grooves 37 has an approximately U-shape and extends from an inner surface to an outer surface of the case 30. Thus, a portion between each of the fixing holes 36 and corresponding one of the spring grooves 37 becomes a spring section. In the present embodiment, each of the fixing holes 36 is a through hole, as an example. Each of the fixing holes 36 may be also a blind hole that does not extend to the outer surface of the case 30.

At least one of the walls having the case-side fixing part has a case-side engaging part so that the portion of the case 30 adjacent to the opening portion 34 does not separate from the housing 51 in the engaging direction of the fixing parts. That is, the case-side engaging part is provided for restricting the engagement of the fixing parts from being released. In the present embodiment, each of the upper wall 32 and the lower wall 33 has two cutting sections 38 as an example of the case-side engaging part. Each of the cutting sections 38 has an approximately rectangular shape and extends from the open edge 35 of the case 30 toward the rear wall 31a in the inserting direction of the printed circuit board 10. The two cutting sections 38 of each of the upper wall 32 and the lower wall 33 are arranged to be line symmetry with respect to the fixing hole 36 of the each of the upper wall 32 and the lower wall 33. An edge portion 39 of each of the cutting sections 38 includes a base part 39a and a taper part 39b. The base part 39a is located from the inner surface of the case 30 to a predetermined distance from the inner surface. The base part 39a has a substantially constant width. The taper part 39b is located from a boundary with the base part 39a to the outer surface of the case 30. A width of the taper part 39b increases from the boundary with the base part 39a to the outer surface of the case 30.

Figure 7:
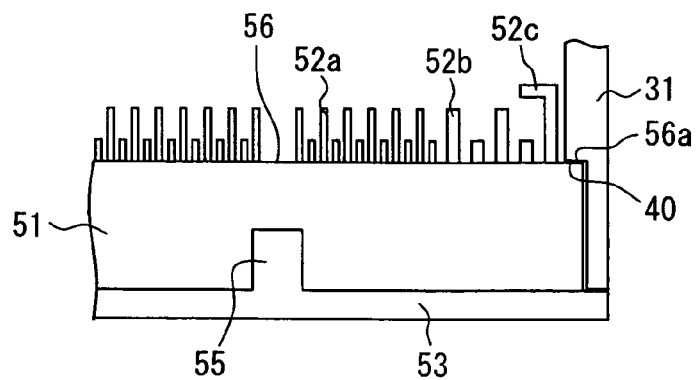
FIG. 7 is a plan view illustrating a longitudinal end portion of a housing.
Figure 8:
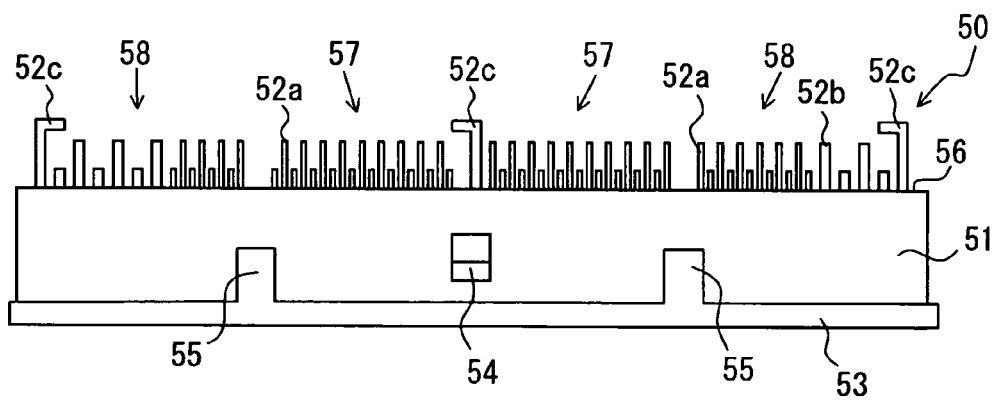
FIG. 8 is a plan view illustrating a connector viewed from an upper wall side of a case.

As illustrated in FIG. 7, the case 30 has contact portions 40 at the inner surface thereof. The terminals 52 extend from a rear surface 56 of the housing 51 toward the land. In a state where the case-side fixing part and the housing-side fixing part engage with each other, each of the contact portions 40 is in contact with corresponding one of longitudinal end portions 56a of the rear surface 56. For example, the case 30 has step portions to provide the contact portions 40. The contact portions 40 may be also protruding portions that protrude from the inner surface of the case 30 toward inside. The contact portions 40 may have other shape as long as the contact portions 40 can function as stoppers.

Figure 2:
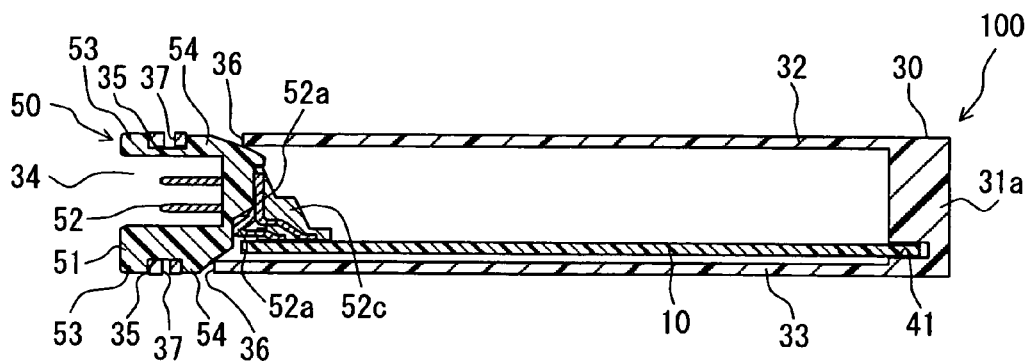
FIG. 2 is a cross-sectional view illustrating the electronic control device taken along line II-II in FIG. 1.
Figure 3:
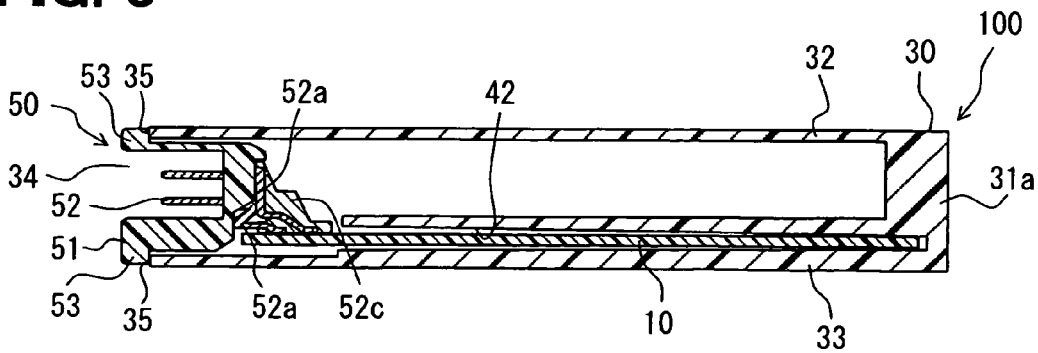
FIG. 3 is a cross-sectional view illustrating the electronic control device taken along line III-III in FIG. 1.

As illustrated in FIG. 2, the rear wall 31a has a holding groove 41 at an inner surface thereof so as to hold an end of the printed circuit board 10 on the rear wall side, i.e., a rear end of the printed circuit board 10. In addition, as illustrated in FIG. 3, each of the two sidewalls 31 adjacent to the opening portion 34 has a guide groove 42 at an inner surface thereof. The guide grooves 42 are configured to guide the printed circuit board 10 to the rear wall side of the case 30.

For example, the holding groove 41 extends from one end to the other end of the rear wall 31a in the longitudinal direction of the housing 51. In a thickness direction of the printed circuit board 10, the holding groove 41 has a substantially constant width. Each of the longitudinal ends of the holding groove 41 communicates with corresponding one of the guide grooves 42. In the thickness direction of the printed circuit board 10, a width of each of the guide grooves 42 decreases toward the rear wall side of the case 30. The width of the holding groove 41 and the width of each of the guide grooves 42 at the communicating portions with the holding groove 41 are substantially equal to or slightly greater than a thickness of the printed circuit board 10. Thus, the width of each of the guide grooves 42 is larger than the thickness of the printed circuit board 10 at a portion adjacent to a front end of the printed circuit board 10 located on an opposite side of the rear end. At the portion adjacent to the front end, the terminals 52 of the connector 50 are coupled with the lands. Thus, the printed circuit board 10 is away from the guide grooves 42 at the portion adjacent to the front end. Thereby, a stress generated at a time when the connector 50 is coupled with the external connector can be released from the rear end of the printed circuit board 10 to the case 30 without concentrating at coupling portions of the terminals 52 and the lands of the printed circuit board 10. Thus, the connectivity of the terminals 52 with the lands can be improved.

The connector 50 includes the housing 51 and the terminals 52 arranged in the housing 51. The housing 51 is made of an insulating material. The terminals 52 are made of a conductive material. The connector 50 is mounted on the portion of the printed circuit board 10 adjacent to the front end.

Figure 9:
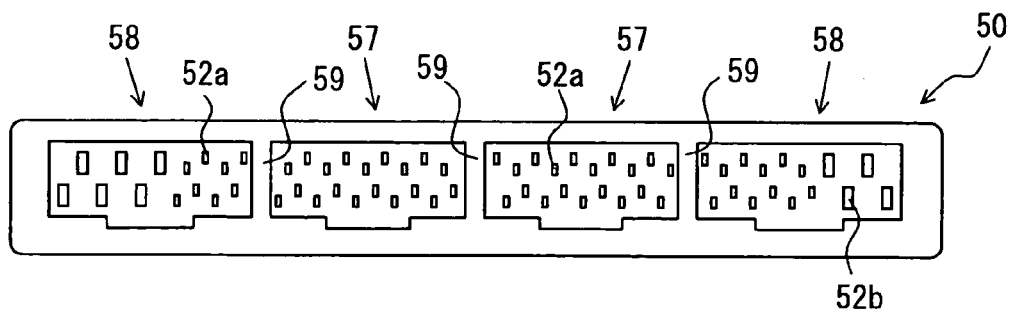
Figure 10:
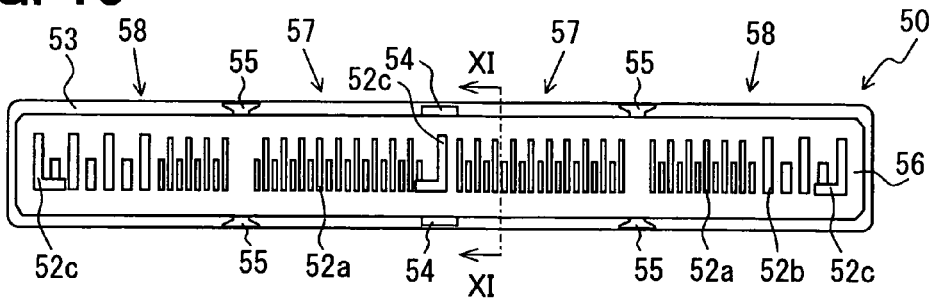

The housing 51 is configured to cover the opening portion 34 of the case 30. As illustrated in FIG. 1, FIG. 2, and FIG. 10, a portion of the housing 51 disposed in the case 30 has an approximately rectangular contour corresponding to an approximately rectangular opening portion 34 defined by the open edge 35. In addition, as illustrated in FIG. 1, FIG. 9, and FIG. 10, another portion of the housing 51 that is in contact with the open edge 35 and is exposed to an outside of the case 30 has an approximately rectangular contour corresponding to the approximately rectangular opening portion 34. The housing 51 has a protruding portion 53 that protrudes to the outside with respect to the portion of the housing 51 disposed in the case 30. For example, the protruding portion 53 has a ring shape so that the protruding portion 53 is in contact with the whole circumference of the open edge 35 of the case 30 in a state where the case-side fixing part and the housing-side fixing part engage with each other.

The housing 51 has the housing-side fixing part corresponding to the case-side fixing part. The housing-side fixing part is located on an outer surface of the housing 51 on the rear end side with respect to the protruding portion 53. For example, as illustrated in FIG. 1, FIG. 2, FIG. 4, FIG. 7, FIG. 8, and FIG. 10, the housing 51 has fixing projections 54 that correspond to the fixing holes 36 provided at the upper wall 32 and the lower wall 33. As illustrated in FIG. 4, each of the fixing projections 54 has an approximately rectangular shape. In addition, each of the fixing projections 54 has a taper part 54b on the rear end side thereof. A thickness of the taper part 54b decreases toward the rear end side. Thereby, when the printed circuit board 10 is inserted into the case 30, the fixing projections 54 can be easily engaged with the fixing holes 36.

Figure 5:
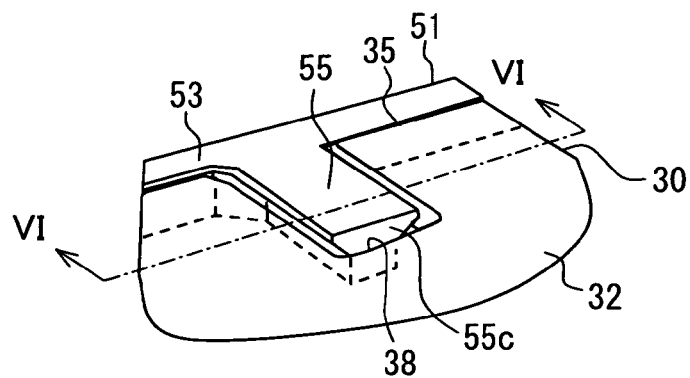
FIG. 5 is a perspective view illustrating an engaging projection and a cutting section.
Figure 6:
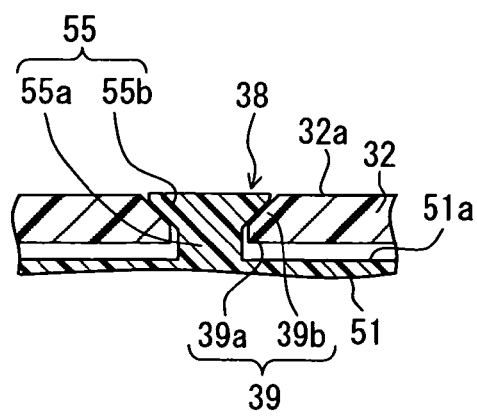
FIG. 6 is a cross-sectional view illustrating the engaging projection and the cutting section taken along line VI-VI in FIG. 5.

Furthermore, the housing 51 has the housing-side engaging part corresponding to the case-side engaging part. The housing-side engaging part is located on the outer surface of the housing 51 on the rear end side with respect to the protruding portion 53. For example, as illustrated in FIG. 1, FIG. 5, FIG. 6-FIG. 8, and FIG. 10, the housing 51 has engaging projections 55. Each of the engaging projections 55 is inserted into corresponding one of the cutting sections 38 provided at the upper wall 32 and the lower wall 33. The engaging projections 55 communicate with the protruding portion 53 of the housing 51 and extend in the inserting direction of the printed circuit board 10. As illustrated in FIG. 6, the portion of the housing 51 disposed in the case 30 has a flat surface 51a. Each of the engaging projections 55 protrudes from the flat surface 51a and has an approximately T-shape in cross section. Each of the engaging projections 55 has a base part 55a and a taper part 55b. The base part 55a is provided from the flat surface 51a to the boundary between the base part 39a and the taper part 39b of the edge portion 39 of the cutting section 38. A width of the base part 55a of the engaging projection 55 is less than the width of the base part 39a. The taper part 55b of the engaging projection 55 is provided on an opposite side of the flat surface 51a with respect to the base part 55a. A width of the taper part 55b increases toward the opposite side of the flat surface 51a. The taper part 55b engages with the taper part 39b of the edge portion 39 of the cutting section 38. In a state where the case 30 is not deformed, an outer surface of each of the engaging projections 55 and the outer surface of the case 30 (e.g., an outer surface 32a of the upper wall 32 in FIG. 6) are located in the approximately same plane. In addition, as illustrated in FIG. 5, each of the engaging projections 55 has a flat end 55c on the rear end side of the printed circuit board 10. In a state where the case-side fixing part and the housing-side fixing part engage with each other and the protruding portion 53 is in contact with the open edge 35 of the case 30, the flat end 55c of each of the engaging projections 55 is in contact with the edge portion 39 of corresponding one of the cutting sections 38.

A protruding height of each of the engaging projections 55 from the flat surface 51a of the housing 51 may be higher than a protruding height of each of the fixing projections 54 from the flat surface 51a. In the present case, in a state where the case-side engage part and the housing-side engage part engage with each other, each of the fixing projections 54 can be easily engaged with corresponding one of the fixing holes 36.

One end portion of each of the terminals 52 extends from the rear surface 56 of the housing 51 and is coupled with corresponding one of the lands through the solder. As illustrated in FIG. 7-FIG. 11, the terminals 52 include first terminals 52a, second terminals 52b, and at least one third terminal 52c, e.g., three third terminals 52c. The first terminals 52a and the second terminals 52 have an electric coupling function between the printed circuit board 10 and the connector 50. One end portion of each of the first terminals 52a and the second terminals 52b extends from the rear surface 56 of the housing 51 and is electrically and mechanically coupled with corresponding one of the lands of the printed circuit board 10 through the solder. The other end portion of each of the first terminals 52a and the second terminals 52b extends from the opposite surface of the rear surface 56 toward an inner space defined by the housing 51. The other end portion of each of the first terminals 52a and the second terminals 52b is configured to be electrically coupled with the external connector. The third terminals 52c do not have an electric coupling function between the connector 50 and the printed circuit board 10. The third terminals 52c are provided for improving the connectivity of the connector 50 with the printed circuit board 10.

The terminals 52 are arranged in the housing 51 in a zigzag manner in the longitudinal direction of the housing 51. In addition, the terminals 52 are arranged in a plurality of rows in a direction perpendicular to an upper surface of the printed circuit board 10, i.e., in the thickness direction of the printed circuit board 10. In the terminals 52, the first terminals 52a are signal terminals for transmitting signals. The second terminals 52b, which are thicker than the first terminals 52a, are power terminals for transmitting electricity from a power element. For example, the first terminals 52a are arranged in four rows in the direction perpendicular to the upper surface of the printed circuit board 10. For example, the second terminals 52b are arranged in two rows in the direction perpendicular to the upper surface of the printed circuit board 10. The connector 50 has first terminal blocks 57 and second terminal blocks 58 arranged in the longitudinal direction of the housing 51. In the first terminal blocks 57, only the first terminals 52a are arranged. In the second terminal blocks 58, the first terminals 52a and the second terminals 52b are arranged. For example, in the longitudinal direction of the housing 51, two first terminal blocks 57 are arranged between two second terminal blocks 58. Separating walls 59 are respectively disposed between adjacent the first terminal blocks 57 and the second terminal blocks 58. Thereby, adjacent terminal blocks 57 and 58 are separated from each other and four terminal ports are provided. The terminal ports are electrically coupled with external devices related to the engine, for example.

As illustrated in FIG. 1, the fixing projections 54 and the engaging projections 55 are formed on the outer surface of the housing 51 in such a manner that the fixing projections 54 and the engaging projections 55 are located on respective lines extended from the separating walls 59. In the three separating walls 59, the engaging projections 55 are located on the respective lines extended from two separating walls 59 located on both longitudinal end sides of the housing 51. The fixing projections 54 are located on the line extended from the center separating walls 59 located between the two end separating walls 59.

The third terminals 52c are reinforcing terminals. Each of the third terminals 52c extends from the rear surface 56 of the housing 51 and is mechanically coupled with corresponding one of the lands. For example, two third terminals 52c are located on the both longitudinal end sides of the housing 51 with respect to the two second terminals blocks 58. One third terminal 52c is located between the first terminal blocks 57. The whole terminals 52 have a surface mounting structure. Thus, the terminals 52 are electrically and mechanically coupled with the lands disposed on the upper surface of the printed circuit board 10.

An exemplary assembling process of the electronic control device 100 will now be described. At first, the connector 50 is mounted on the printed circuit board 10. Because the terminals 52 have the surface mounting structure, the terminals 52 are soldered with the corresponding lands by a reflow process. When the connector 50 is mounted on the printed circuit board 10, the other electronic elements (not shown) are also mounted.

Then, the rear end of the printed circuit board 10, which is located on the opposite side of the portion where the connector 50 is mounted, is inserted into the case 30. At the present time, the printed circuit board 10 is guided to the rear wall 31a by the guide grooves 42 provided at the sidewalls 31 adjacent to the opening portion 34. When the rear end of the printed circuit board 10 is inserted into the holding groove 41 or when a part of the rear end is inserted into the holding groove 41 while leaving an insertion margin, each of the engaging projections 55 engages with the edge portion 39 of the corresponding one of the cutting sections 38. When the printed circuit board 10 is further inserted toward the rear wall side in a state where each of the engaging projections 55 engages with the edge portion 39 of corresponding one of the cutting sections 38, each of the fixing projections 54 engages with corresponding one of the fixing holes 36. In addition, the open edge 35 of the case 30 comes into contact with the protruding portion 53 of the housing 51, and the longitudinal end portions 56a of the rear surface 56 of the housing 51 come into contact with the contact portions 40 formed on the inner surface of the case 30. Thereby, the printed circuit board 10 is housed in the case 30 having the approximately rectangular box shape and the opening portion 34 of the case 30 is covered with the housing 51 of the connector 50 mounted on the printed circuit board 10.

In the present electronic control device, the fixing holes 36 that configurate the case-side fixing parts and the cutting sections 38 that configurate the case-side engaging parts are provided at the upper wall 32 and the lower wall 33. In addition, the engaging projections 55 are formed in the housing 51 so that each of the engaging projections 55 engages with the edge portion 39 of corresponding one of the cutting sections 38. Thus, even if a wall of the case 30 having a case-side fixing part, for example, the upper wall 32 warps convexly toward the outside of the case 30 in the vicinity of the opening portion 34 due to a change in a temperature, as illustrated by the broken line 32b in FIG. 1, the case 30 is restricted from separating from the housing 51 by the engagements of the engaging parts configured by the cutting sections 38 and the engaging projections 55. That is, the engagements of the case-side fixing parts and the housing-side fixing parts are restricted from being released by the engagements of the case-side engaging parts and the housing-side engaging parts. Thus, the case 30 and the connector 50 are fixed to each other with a high degree of certainty.

As a result, the warp of the case 30 is restricted and a stress applied to the connector 50 can be released to the case 30 in the vicinity of the opening portion 34. For example, even if an external connector 110 is lifted as illustrated by the arrows 111 in FIG. 11 when the external connector 110 is fitted into the connector 50 or in a state where the external connector 110 is fitted with the connector 50, a stress 112 applied from the external connector 110 to the connector 50 can be released to the lower wall 33 of the case 30 via portions in the vicinity of the opening portion 34, i.e., via the fixing parts, the engaging parts, and contacting parts of the case 30 with the housing 51. Even if the external connector 110 is pushed down as illustrated by the dashed arrows 113 in FIG. 11, a stress 114 applied from the external connector 110 to the connector 50 can be released to the upper wall 32 of the case 30 via the portions in the vicinity of the opening portion 34, i.e., via the fixing parts, the engaging parts, and the contacting parts of the case 30 with the housing 51. Thus, in the present electronic control device 100, a stress applied to the coupling portions of the terminals 52 with the lands can be reduced.

An electronic control device according to a comparative example includes the fixing parts but does not include the engaging parts. In the electronic control device according to the comparative example, the case 30 has a possibility to warp due to a change in the temperature. For example, when the case 30 warps and a width of the open edge 35 is expanded, a rattle may be generated between the portion of the case 30 in the vicinity of the opening portion 34 and the housing 51. If the external connector 110 is lifted as illustrated by the arrows 111 in FIG. 12 when the external connector 110 is fitted into the connector 50 or in a state where the external connector 110 is fitted with the connector 50, the stress 112 applied from the external connector 110 to the connector 50 is released to the lower wall 33 of the case 30 via the coupling portions of the terminals 52 with the lands, the printed circuit board 10, and the holding groove 41. Thus, in the electronic control device according to the comparative example, the stress applied to the coupling portions of the terminals 52 and the lands is large and the connectivity of the terminals 52 with the lands may be reduced compared with the electronic control device 100 according to the present embodiment. In addition, in the electronic control device according to the comparative example, if the engagements of the fixing parts are released due to the warp of the case 30, the connector 50 may be pulled toward the opposite side of the inserting direction as illustrated by the arrow 115 in FIG. 13, and thereby the printed circuit board 10 may fall away from the case 30. Furthermore, because the engagements of the fixing parts are released, if the external connector 110 is pushed down as illustrated by the dashed arrows 113, the printed circuit board 10 may vibrate in the case 30 as illustrated by the arrows 116.

Figure 11:
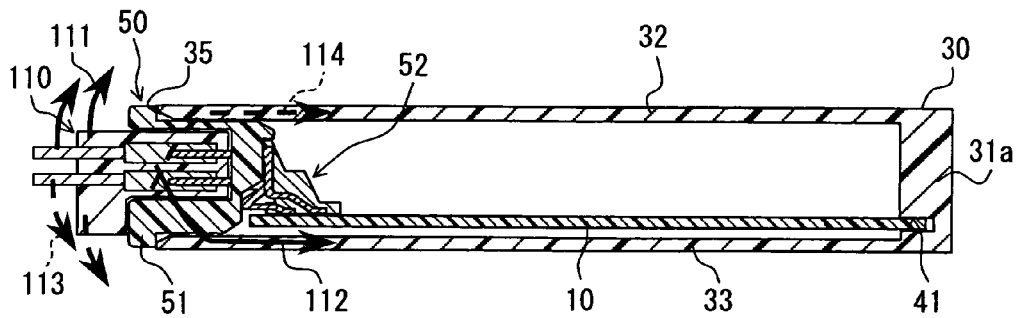
FIG. 11 is a cross-sectional view illustrating a transmittance of a stress generated at a time when the electronic control device is fitted with the external connector.
Figure 12:
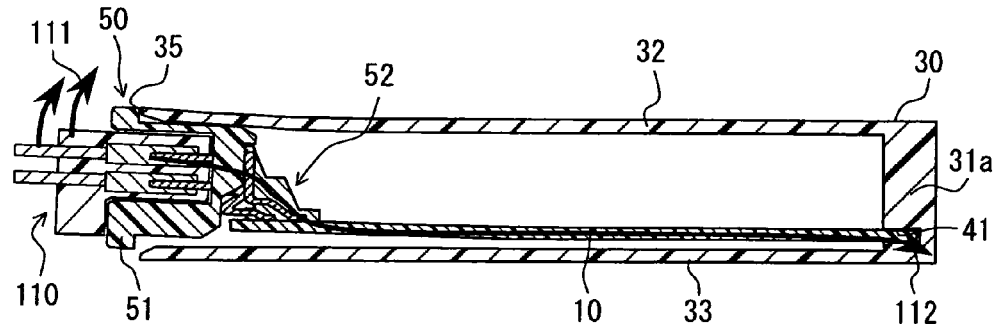
FIG. 12 is a cross-sectional view illustrating a transmittance of a stress generated at a time when an electronic control device according to a comparative example is fitted with the external connector.
Figure 13:
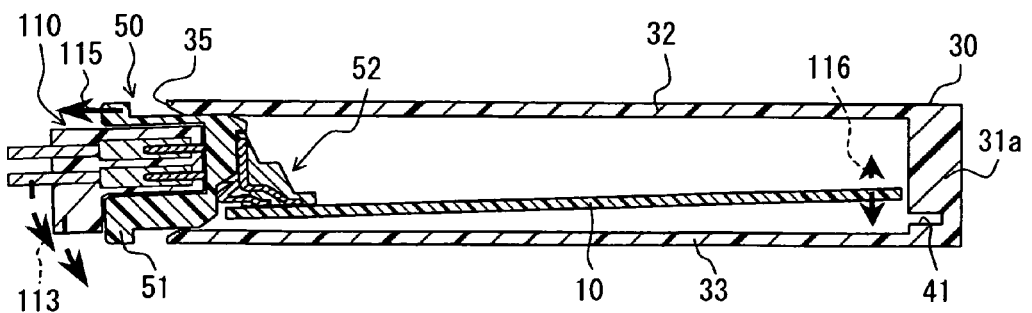
FIG. 13 is a cross-sectional view illustrating the electronic control device according to the comparative example in which engagements of the fixing projections and the fixing holes are released.

In the electronic control device 100, the upper wall 32 and the lower wall 33 that are subject to warp have the fixing holes 36, which configurates the case-side fixing parts, and the cutting sections 38, which configurate the case-side engaging parts. Thus, the warp of the case 30 can be effectively restricted by the engagements of the case-side engaging parts and the housing-side engaging parts. In addition, because the upper wall 32 and the lower wall 33 that face each other have the case-side fixing parts and the case-side engaging parts, the warp of the case 30 can be effectively restricted and the case 30 is fixed to the connector 50 with a high degree of certainty. Thereby, as illustrated in FIG. 11, a gouge of the connector 50 by the case 30 can be effectively restricted.

Because each of the case-side fixing parts is located between two case-side engaging parts, the engagements of the case-side fixing parts and the housing-side fixing parts can be effectively restricted from being released by the engagements of the case-side engaging parts and the housing-side engaging parts. On each of the upper wall 32 and the lower wall 33, the fixing hole 36 is located at a middle portion in a direction approximately perpendicular to the inserting direction of the printed circuit board 10, and the two cutting sections 38, which configurate the case-side engaging parts, are arranged to be line symmetry with respect the fixing hole 36. Thus, when the case 30 is fixed to the housing 51, stresses generated at the two case-side engaging parts are substantially equal to each other and a bias of the stress toward one of the engaging parts can be restricted.

The cutting sections 38 extend from the open edge 35 of the case 30 toward the rear wall 31a in the inserting direction of the printed circuit board 10. Thus, when the printed circuit board 10 is inserted into the case 30, each of the engaging projections 55 can engage with the edge portion 39 of corresponding one of the cutting sections 38 from the open edge 35. Therefore, the electronic control device 100 can be assembled easily.

In the housing 51, the separating walls 59 are located between adjacent terminal ports. The fixing projections 54, which configurate the housing-side fixing parts, and the engaging projections 55, which configurate the housing-side engaging parts, are formed on respective lines extended from the separating walls 59. In this way, by forming the housing-side fixing parts and the housing-side engaging parts at rigid portions of the housing 51, the housing 51 is restricted from being deformed.

The case 30 has the spring grooves 37 adjacent to the fixing holes 36 and the portions between the fixing holes 36 and the spring grooves 37 have a spring function. Thus, each of the fixing projections 54 can easily engage with corresponding one of the fixing holes 36 and the engagements of the fixing projections 54 and the fixing holes 36 are restricted from being released. In addition, the stress applied to the case-side fixing parts and the housing-side fixing parts can be reduced.

In the electronic control device 100, the housing 51 has the protruding portion 53 that is in contact with the open edge 35 of the case 30 in a state where the case-side fixing parts and the housing-side fixing parts engage with each other. Thus, a contact area of the case 30 with the connector 50 increases by a contact area of the open edge 35 of the case 30 with the protruding portion 53. Accordingly, a stress generated at a time when the connector 50 is fitted with the external connector can be effectively released from the housing 51 to the case 30 through the portions of the case 30 adjacent to the opening portion 34. Thus, the connectivity of the terminals 52 and the lands can be improved. In addition, because the protruding portion 53 is communicated with the engaging projections 55, a rigidity of the engaging projections 55 increases and the case 30 can be fixed to the connector 50 with a high degree of certainty.

On the inner surface of the case 30, the contact portions 40 are formed. Each of the contact portions 40 is in contact with corresponding one of the longitudinal end portions 56a of the rear surface 56 of the housing 51 in the state where the case-side fixing parts and the housing-side fixing parts engage with each other. Thus, the contact area of the case 30 with the connector 50 increases by a contact area of the housing 51 with the contact portions 40. Accordingly, the stress generated at the time when the connector 50 is fitted with the external connector can be effectively released from the longitudinal end portions 56a of the housing 51 to the case 30. Thus, the connectivity of the terminals 52 with the lands can be improved. Thus, a gouge in the longitudinal direction of the housing 51 can be restricted.

Each of the flat ends 55c of the engaging projections 55 is in contact with the edge portion 39 of corresponding one of the cutting sections 38 in the state where the case-side fixing parts and the housing-side fixing parts engage with each other. Thereby, the connectivity of the terminals 52 and the lands are further improved.

Figure 14:
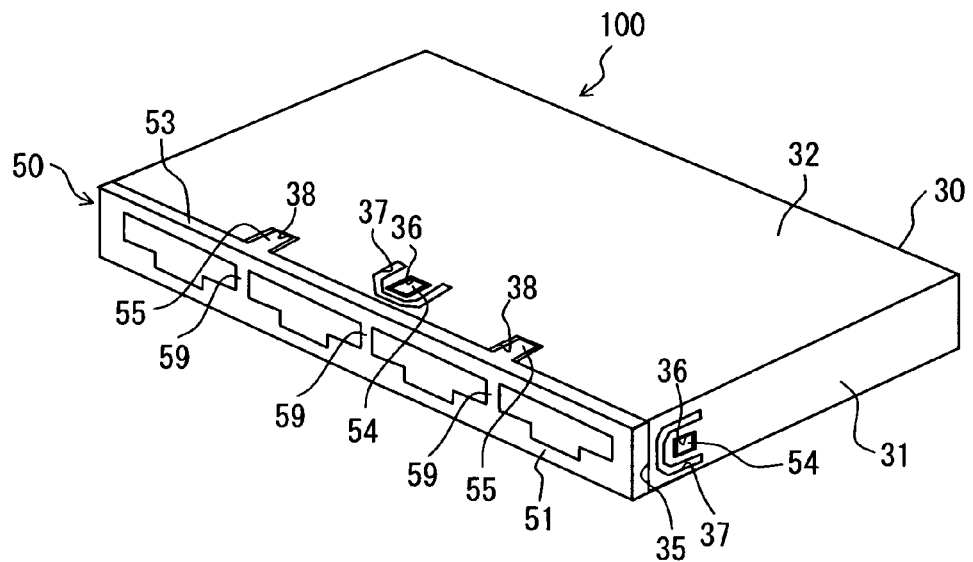
FIG. 14 is a perspective view illustrating an electronic control device according to a first modification of the first embodiment.

In the electronic control device 100 illustrated in FIG. 1-FIG. 11, the fixing holes 36 are provided at the upper wall 32 and the lower wall 33. Alternatively, the fixing holes 36 may be provided at other wall. For example, as illustrated in FIG. 14, the fixing holes 36 and the spring grooves 37 may be provided at the sidewalls 31 in addition to the upper wall 32 and the lower wall 33. Because each of the sidewalls 31 is smaller than each of the upper wall 32 and the lower wall 33, the sidewalls 31 are difficult to warp. Thus, the cutting sections 38, which configurate the case-side engaging parts, are not provided at the sidewalls 31 in a modification illustrated in FIG. 14. However, the sidewalls 31 may have the case-side fixing parts and the engaging parts.

Figure 15:
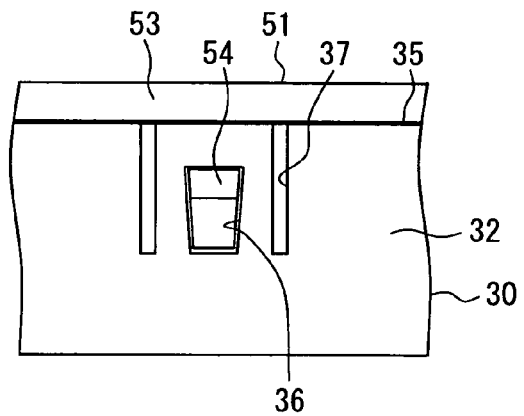
FIG. 15 is a plan view illustrating an electronic control device according to a second modification of the first embodiment.

In the electronic control device 100 illustrated in FIG. 1-FIG. 11, the fixing holes 36 and the fixing projection 54 have the approximately rectangular plane shapes. Alternatively, the fixing holes 36 and the fixing projections 54 may have other shape as long as each of the fixing projections 54 can engage with corresponding one of the fixing holes 36. For example, as illustrated in FIG. 15, the fixing holes 36 and the fixing projections 54 may have approximately trapezoid plane shapes each having a width decreasing toward the rear wall side. In the present case, when the printed circuit board 10 is inserted into the case 30, narrower portions of the fixing projections 54 reach broader portions of the fixing holes 36 before the broader portions of the fixing projections 54 reach. Thus, even if the fixing holes 36 and the fixing projections 54 are out of alignments in the longitudinal direction of the housing 51, the alignments are corrected by engaging the fixing projections 54 with the fixing holes 36.

The shape of the spring grooves 37 is not limited to the approximately U-shape. For example, as illustrated in FIG. 15, two spring grooves 37 each having a linear shape extending from the open edge 35 toward the rear wall side may be arranged on opposite sides of the fixing holes 36.

Figure 16:
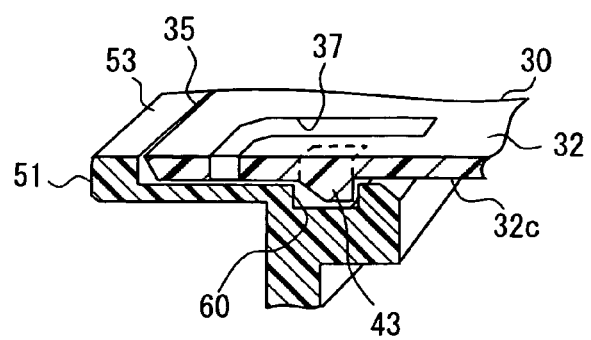
FIG. 16 is a perspective view illustrating an electronic control device according to a third modification of the first embodiment.

In the electronic control device 100 illustrated in FIG. 1-FIG. 11, the case 30 have the fixing holes 36 and the housing 51 have the fixing projections 54, as an example. Alternatively, as illustrated in FIG. 16, the case 30, for example, the upper wall 32 may have a fixing projection 43 that protrudes from an inner surface 32c thereof toward the housing 51 and the housing 51 may have a fixing hole 60 so that the fixing projection 43 can engage with the fixing hole 60. In the present case, the fixing hole 60 may be a blind hole.

Figure 17:
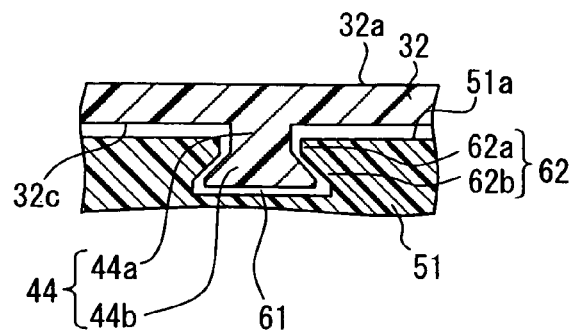
FIG. 17 is a perspective view illustrating an electronic control device according to a fourth modification of the first embodiment.

In the electronic control device 100 illustrated in FIG. 1-FIG. 11, the case 30 have the cutting section 38 and the housing 51 have the engaging projections 55, as an example. Alternatively, as illustrated in FIG. 17, the case 30, for example, the upper wall 32 may have an engaging projection 44 that protrudes from the inner surface 32c toward the housing 51 and the housing 51 may have an engaging groove 61 so that the engaging projection 44 can engage with an edge portion 62 of the engaging groove 61. The engaging projection 44 has a base part 44a and a taper part 44b. The base part 44a is located between the inner surface 32c and a predetermined distance from the inner surface 32c and has a substantially constant width. The taper part 44b is located on the downside of the base part 44a and a width of the taper part 44b increases toward the downside. The edge portion 62 of the engaging groove 61 has a base part 62a and a taper part 62b. The base part 62a is located between the flat surface 51a of the housing 51 and a predetermined distance from the flat surface 51a. The base part 62a corresponds to the base part 44a and has a substantially constant width. The taper part 62b is located on the downside of the base part 44a and a width of the taper part 62b increases toward the downside. The taper part 44b of the case 30 engages with the taper part 62b of the housing 51.

Each of the case-side engaging parts and the housing-side engaging parts may also have an approximately trapezoid plate shape having a width decreasing toward the rear wall side. In the present case, the positioning of the case 30 and the housing 51 in the longitudinal direction of the housing 51 can be improved.

Second Embodiment

Figure 18:
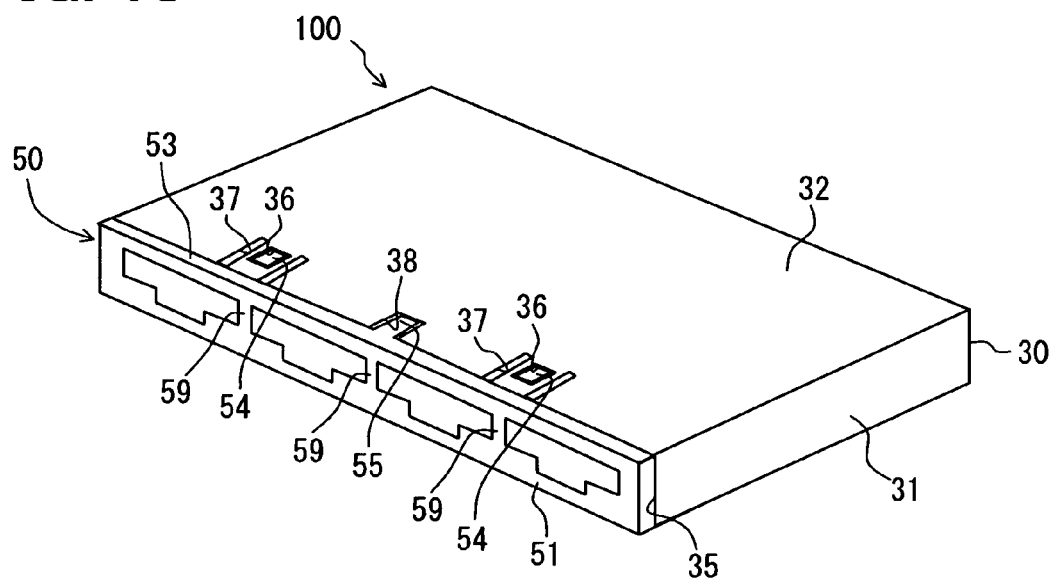
FIG. 18 is a perspective view illustrating an electronic control device according to a second embodiment of the invention.

An electronic control device 100 according to a second embodiment of the invention will be described with reference to FIG. 18, FIG. 19A, and FIG. 19B.

Because the present electronic control device 100 has many portions in common with the electronic control device 100 according to the first embodiment, a description of the common portions will be omitted and different portions will be mainly described. Components of the present electronic control device 100 have the same reference numbers with similar components of the electronic control device 100 according to the first embodiment.

In the electronic control device 100 according to the present embodiment, each of the upper wall 32 and the lower wall 33 has the cutting section 38, which configurates the case-side engaging part, at the middle portion in the direction approximately perpendicular to the inserting direction of the printed circuit board 10. In addition, each of the upper wall 32 and the lower wall 33 has two fixing holes 36, which configurate the case-side fixing parts. The two fixing holes 36 are provided to be line symmetry with respect to the cutting section 38. The spring grooves 37 are provided in the vicinity of respective one of the fixing holes 36. The housing 51 has the fixing projections 54 and the engaging projections 55 so that each of the fixing projections 54 engages with corresponding one of the fixing holes 36 and each of the engaging projections 55 engage with corresponding one of the cutting sections 38. The housing-side fixing parts configured by the fixing projections 54 and the engaging parts configured by the engaging projections 55 are located on respective lines extended from the separating walls 59.

In the electronic control device 100 according to the present embodiment, each of the case-side engaging parts is located between two case-side fixing parts. That is, each of the upper wall 32 and the lower wall 33 has a plurality of case-side fixing parts. Thus, the case 30 is fixed to the connector 50 with a high degree of certainty even if the electronic control device 100 is applied with a stress in the inserting direction of the printed circuit board 10. In addition, a gouge in the longitudinal direction of the housing 51 is restricted.

Figure 19A:
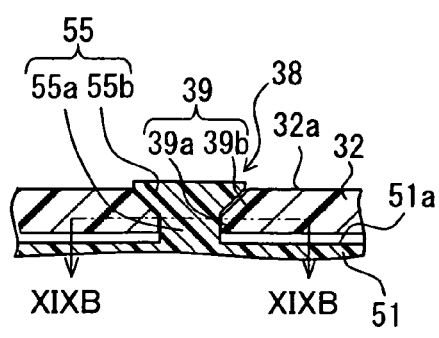
FIG. 19A is a cross-sectional view illustrating a cutting section and an engaging projection according to the second embodiment and FIG. 19B is a cross-sectional view illustrating the cutting section and the engaging projection taken along line XIXB-XIXB in FIG. 19A.
Figure 19B:
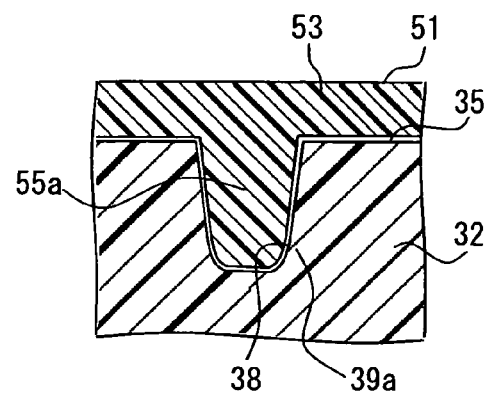

As illustrated in FIG. 19A and FIG. 19B, each of the cutting sections 38 has an approximately trapezoid plane shape that has a width decreasing toward the rear wall side. Each of the engaging projections 55 also has an approximately trapezoid plane shape corresponding to the cutting sections 38. In the present case, the positioning of the case 30 and the housing 51 in the longitudinal direction of the housing 51 can be improved. A clearance between each of the engaging projections 55 and the edge portion 39 of corresponding one of the cutting sections 38 is smaller than a clearance between each of the fixing projections 54 and corresponding one of the fixing holes 36. Thereby, the positioning of the case 30 and the housing 51 at the middle portion of the case 30 can be improved. Thus, a gouge that may be generated between the housing 51 and the case 30 can be reduced.

The various modifications described in the first embodiment may be applied to the present electronic control device 100.

Third Embodiment

Figure 20:
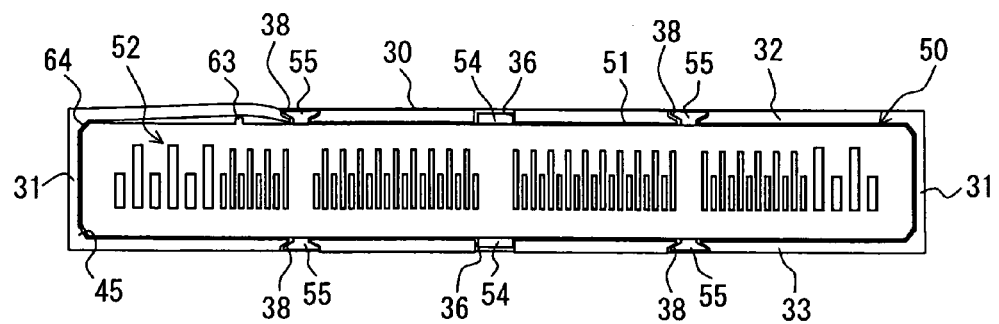
FIG. 20 is a plan view illustrating an electronic control device according to a third embodiment of the invention.
Figure 21:
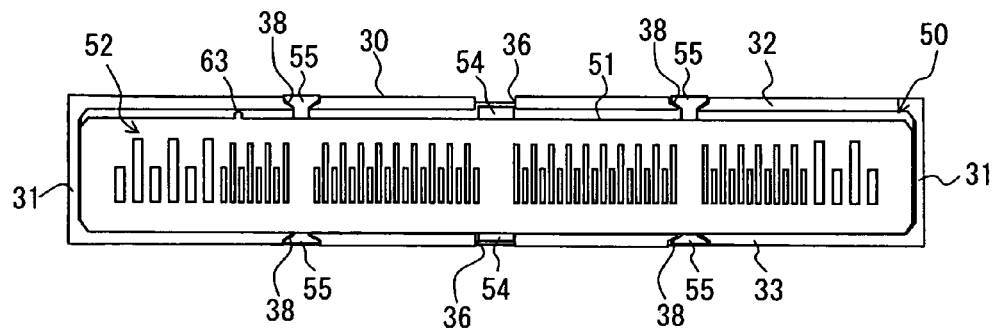
FIG. 21 is a plan view illustrating the electronic control device according to the third embodiment at a time when a clearance is generated between a housing and a case.

An electronic control device 100 according to a third embodiment of the invention will be described with reference to FIG. 20-FIG. 23. In FIG. 20, the case 30 is illustrated in cross section and the printed circuit board 10 is not illustrated as a matter of convenience.

Because the present electronic control device 100 has many portions in common with the electronic control device 100 according to the first embodiment, a description of the common portions will be omitted and different portions will be mainly described. Components of the present electronic control device 100 have the same reference numbers with similar components of the electronic control device 100 according to the first embodiment.

In the present electronic control device 100, the housing 51 has a lifting projection 63 on the flat surface 51a. The lifting projection 63 is located on an opposite side of one of the engaging projections 55 from one of the fixing projections 54. A protruding height of the lifting projection 63 from the flat surface 51a is less than the protruding height of the engaging projection 55. Other components in the present electronic control device 100 are similar to those in the electronic control device 100 according to the first embodiment.

The lifting projection 63 lifts a portion of the case 30 located over the lifting projection 63 from the housing 51. By lifting the case 30, the one engaging projection 55 can engage with the edge portion 39 of corresponding one of the cutting sections 38 more firmly at an outer surface side of the case 30. Thus, even if the opening portion 34 is expanded and a clearance is generated between the inner surface of the case 30 and the flat surface 51a of the housing 51 due to a warp of the case 30, the lifting projection 63 can restrict a rattle between the case 30 and the connector 50 due to the clearance. In addition, a stress generated at a time when the connector 50 is fitted with the external connector can be effectively released from the housing 51 to the case 30 via the lifting projection 63. Because the lifting projection 63 is located on the opposite side of the one engaging projection 55 from the one fixing projection 54, the one fixing projection 54 can engage with corresponding one of the fixing holes 36 with a high degree of certainty even if the case 30 is lifted by the lifting projection 63.

When the housing 51 has the lifting projection 63, a stress may concentrate at corner portions 64 of the housing 51. When the corner portions 64 are rounded as illustrated in FIG. 20, the stress concentration can be reduced. Because the stress may concentrate, a thickness of each of corner portions 45 of the case 30 that correspond to the corner portions 64 of the housing 51 may be larger than other portion of the case 30. This structure may be also applied to the first embodiment, the second embodiment, and the modifications of the first embodiment.

Figure 22:
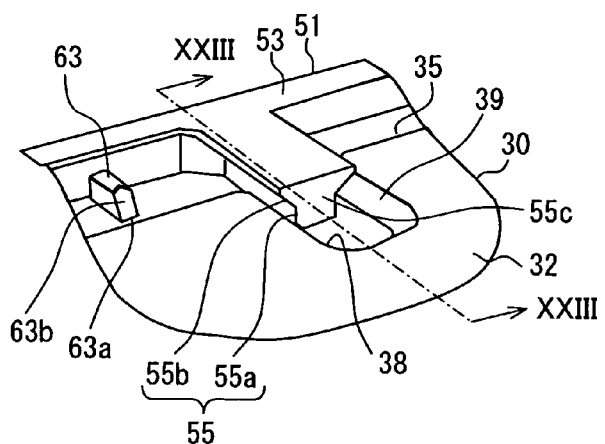
FIG. 22 is a perspective view illustrating a cutting section and an engaging projection according to the third embodiment.

In the inserting direction of the printed circuit board 10, a rear end 63a of the lifting projection 63 is farther away from the rear wall 31a of the case 30 than the flat end 55c of the engaging projection 55, as illustrated in FIG. 22. In the present case, the lifting projection 63 comes into contact with the case 30 after the engaging projection 55 engages with the edge portion 39 of the cutting section 38. Thus, the engaging projection 55 can be engaged with the edge portion 39 of the cutting section 38 with certainty.

Figure 23:
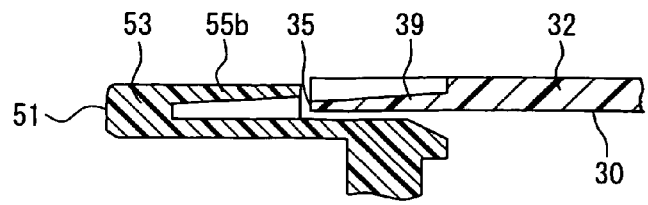
FIG. 23 is a cross-sectional view illustrating the cutting section and the engaging projection taken along line XXIII-XXIII in FIG. 22.

As illustrated in FIG. 23, a thickness of the edge portion 39 of each of the cutting section 38 may increase toward the rear wall side and a thickness of each of the engaging projection 55 may decrease toward the rear wall side corresponding to the edge portion 39 of corresponding one of the cutting sections 38. In the present case, each of the engaging projection 55 can engage with the edge portion 39 of corresponding one of the cutting sections 38 with certainty even if the housing 51 is slightly separated from the case 30 at a time when the printed circuit board 10 is inserted into the case 30. As a result, the engagements of the case-side fixing parts and the housing-side fixing parts can be effectively restricted from being released.

The lifting projection 63 may be provided in the electronic control device 100 according to the first embodiment or the modifications of the first embodiment. The case 30 may also have the lifting projection 63. The shape of engage projections 55 and the shape of the cutting sections 38 according to the present embodiment may also applied to the electronic control device 100 according to the first embodiment, the modifications of the first embodiment, or the second embodiment.

Other Embodiments

Although the present invention has been fully described in connection with the preferred embodiments thereof with reference to the accompanying drawings, it is to be noted that various changes and modifications will become apparent to those skilled in the art.

In the first to third embodiments, the case 30 has the fixing holes 36 and the cutting sections 38 and the housing 51 has the fixing projections 54 and the engaging projections 55, as an example. Alternatively, the case 30 may have the fixing holes 36 and the engaging projections 44 and the housing 51 may have the fixing projections 54 and the engaging grooves 61. That is, the case 30 has one of a fixing hole and a fixing projection and one of an engaging projection and an engaged section (e.g., cutting section or engaging groove). In addition, the housing 51 has the other one of the fixing hole and the fixing projection and the other one of the engaging projection and the engaged section.

In the first to third embodiments, each of the upper wall 32 and the lower wall 33 has the case-side fixing part and case-side engaging part. A wall where the case-side fixing part and the case-side engaging part are provided is not limited to the upper wall 32 and the lower wall 33. For example, only the sidewalls 31 may have the case-side fixing part and the case-side engaging part. Alternatively only one of the upper wall 32 and the lower wall 33 may have the case-side fixing part and the case-side engaging part.

In the first embodiment, one wall has one case-side fixing part and two case-side engaging parts. In the second embodiment, one wall has two case-side fixing parts and one case-side engaging part. Alternatively, the number of the case-side fixing part and the case-side engaging part provided on one wall is not limited to the above-described example. For example, one wall may have one case-side fixing part and one case-side engaging part. Alternatively, one wall may have a plurality of case-side fixing parts and a plurality of case-side engaging parts.

In the first to third embodiments, the terminals 52 of the connector 50 have the surface mounting structure. The shapes of the terminals 52 are not limited to the above-described example. The terminals 52 may also have an insertion mounting structure or the terminals 52 may also have the surface mounting structure and the insertion mounting structure.

In the first to third embodiments, the terminals 52 include the first terminals 52*a*, the second terminals 52*b*, and the third terminals 52*c*, as an example. The kind of the terminals 52 is not limited to the above-described example. For example, the terminals 52 may have only the first terminals 52*a* and the second terminals 52*b*. The number, the type, and the arrangement of the terminal block are not limited to the above-described example. For example, the second terminals 52*b* arranged at both longitudinal end portions of the connector 50 in FIG. 9 may be arranged above the first terminals 52*a*, i.e., in a fifth row in each of the terminal blocks 57 and 58. Furthermore, the number of row and the arrangement of the terminals 52 in the housing 51 are not limited to the above-described example.

In the first to third embodiment, the electronic control device 100 is described as an example of an electronic device. The electronic control device may also be other device as long as the device includes the printed circuit board 10, the connector 50 mounted on the printed circuit board 10, and the case 30 housing the printed circuit board 10 therein and the opening portion 34 provided on one side of the case 30 is covered with the housing 51 of the connector 50.

In the first to third embodiments, the spring grooves 37 are provided in the vicinity of the fixing holes 36 so that the portions of the case 30 located between the spring grooves 37 and the fixing holes 36 become the spring sections having the spring function. Alternatively, the fixing projections 54 may be configured to be spring sections having the spring function.

In the first to third embodiments, the rear wall 31*a* of the case 30 has the holding groove 41. The shape and the position of the holding groove 41 are not limited to the above-described example. Furthermore, the shape and the position of the guide grooves 42 are not limited to the above-described example. For example, the electronic control device 100 may not have the holding groove 41. Alternatively, each of the holding groove 41 and the guide grooves 42 may have a discontinuous shape.

In the first to third embodiments, the protruding portion 53 has the ring shape so as to come into contact with the whole circumference of the case 30. In addition, the protruding portion 53 communicates with the engaging projections 55. The protruding portion 53 may also be away from the engaging projections 55 or the protruding portion 53 may also have a discontinuous shape.

In the first to third embodiment, the fixing parts and the engaging parts are configured so that the engaging projections 55 engage with the edge portions 39 of the cutting sections 38 (i.e., the engage parts engage with each other) before the fixing projections 54 engages with the fixing holes 36 (i.e., the fixing parts engage with each other). Alternatively, the fixing parts may engage with each other before the engaging parts engage with each other.

Figure 24:
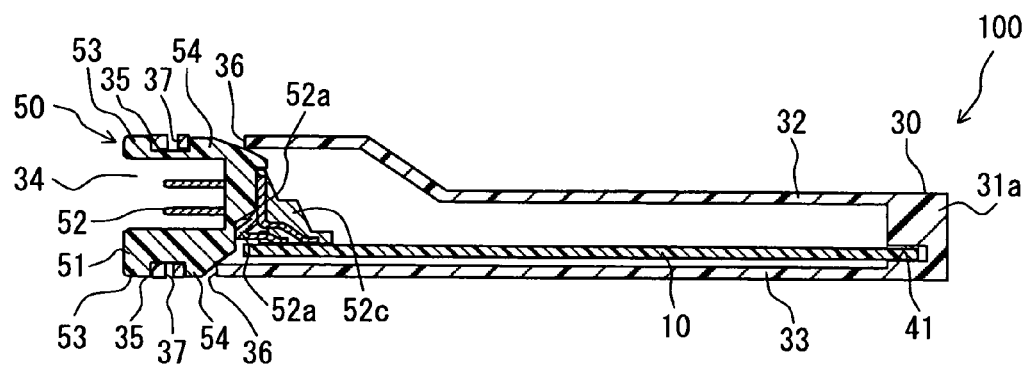
FIG. 24 is a cross-sectional view illustrating an electronic control device according to another modification.

In the first to third embodiments, each of the upper wall 32 and the lower wall 33 is approximately flat. Alternatively, one of the upper wall 32 and the lower wall 33 may have a step portion. For example, the upper wall 32 may have a step portion, and a front section of the upper wall 32 located on a front side of the step portion and adjacent to the opening portion 34 may be higher than a rear section of the upper wall 32 located on a rear side of the step portion, as illustrated in FIG. 24.

Figure 25:
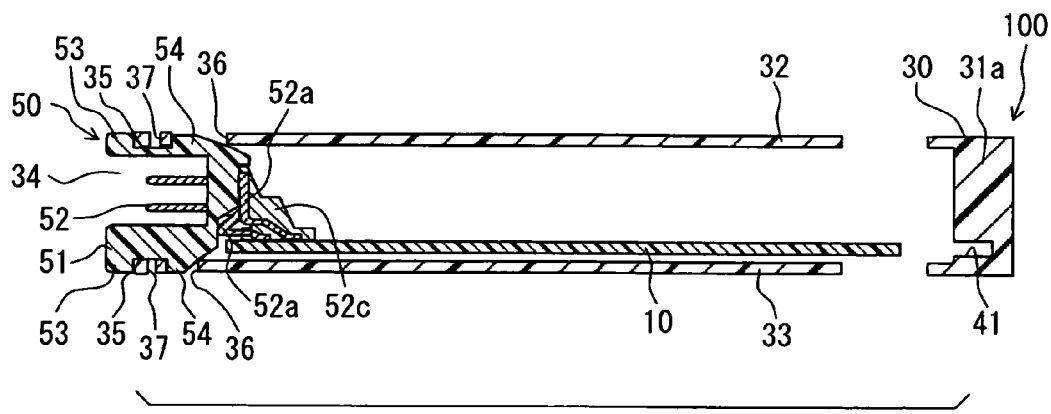
FIG. 25 is a cross-sectional view illustrating an electronic control device according to another modification.

In the first to third embodiments, the rear wall 31*a* is integrally formed with the upper wall 32, the lower wall 33, and the two sidewalls 31 adjacent to the opening portion 34. Alternatively, the rear wall 31*a* may be formed separately from the upper wall 32, the lower wall 33, and the two sidewalls 31 adjacent to the opening portion 34. In the present case, the printed circuit board 10 may be inserted into a case formed of the upper wall 32, the lower wall 33, and the two sidewalls 31 and having an approximately rectangular tubular shape, as illustrated in FIG. 25, and then the rear wall 31*a* may be fixed to the case so that the holding groove 41 of the rear wall 31 is fitted with the rear end of the printed circuit board 10.

What is claimed is:

1. An electronic device comprising:
a printed circuit board having an electronic element and a plurality of lands;
a case having an approximately rectangular tubular shape, wherein an end of the approximately rectangular tubular shape opens to provide an opening portion from which the printed circuit board is inserted into the case; and
a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:
the case includes a wall having a case-side fixing part and a case-side engaging part at a portion adjacent to the opening portion;
the housing has a housing-side fixing part and a housing-side engaging part at a surface facing the wall of the case;
the case-side fixing part is one of a fixing projection and a fixing hole and the housing-side fixing part is the other one of the fixing projection and the fixing hole;
the case-side fixing part engages with the housing-side fixing part for fixing the case and the housing to each other;
the case-side engaging part is one of an engaging projection and an engaged section and the housing-side engaging part is the other one of the engaging projection and the engaged section;
the case-side engaging part engages with the housing-side engaging part for restricting the portion of the case adjacent to the opening portion from separating from the housing;
the case-side engaging part is the engaged section provided by a cutting section;
the cutting section extends from an end of the wall adjacent to the opening portion toward an opposite side of the opening portion in the inserting direction of the printed circuit board;
the housing-side engaging part is the engaging projection; and
the engaging projection is engaged with an edge portion of the cutting section on an outer surface side of the wall.

2. The electronic device according to claim 1, wherein:
the case includes first to fourth walls defining the approximately rectangular tubular shape;

the first wall faces the second wall and the third wall faces the fourth wall;

each of the first wall and the second wall is larger than each of the third wall and the fourth wall; and each of the first wall and the second wall has the case-side fixing part and the case-side engaging part.

3. The electronic device according to claim 1, wherein:

the wall has a plurality of case-side fixing parts separating from each other; and the case-side engaging part is located between two of the plurality of case-side fixing parts.

4. The electronic device according to claim 1, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

5. The electronic device according to claim 1, wherein:

the edge portion of the cutting section has a thickness increasing toward the opposite side of the opening portion in the inserting direction of the printed circuit board; and the engaging projection has a thickness decreasing toward the opposite side of the opening portion so as to correspond to the edge portion.

6. The electronic device according to claim 5, wherein:

the case includes first to fourth walls defining the approximately rectangular tubular shape;

the first wall faces the second wall and the third wall faces the fourth wall;

each of the first wall and the second wall is larger than each of the third wall and the fourth wall; and each of the first wall and the second wall has the case-side fixing part and the case-side engaging part.

7. The electronic device according to claim 5, wherein:

the wall has a plurality of case-side fixing parts separating from each other; and the case-side engaging part is located between two of the plurality of case-side fixing parts.

8. The electronic device according to claim 5, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

9. An electronic device comprising:

a printed circuit board having an electronic element and a plurality of lands;

a case having an approximately rectangular tubular shape, wherein an end of the approximately rectangular tubular shape opens to provide an opening portion from which the printed circuit board is inserted into the case; and a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:

the case includes a wall having a case-side fixing part and a case-side engaging part at a portion adjacent to the opening portion;

the housing has a housing-side fixing part and a housing-side engaging part at a surface facing the wall of the case;

the case-side fixing part is one of a fixing projection and a fixing hole and the housing-side fixing part is the other one of the fixing projection and the fixing hole;

the case-side fixing part engages with the housing-side fixing part for fixing the case and the housing to each other;

the case-side engaging part is one of an engaging projection and an engaged section and the housing-side engaging part is the other one of the engaging projection and the engaged section;

the case-side engaging part engages with the housing-side engaging part for restricting the portion of the case adjacent to the opening portion from separating from the housing;

the case-side engaging part is the engaging projection extending in the inserting direction of the printed circuit board;

the housing-side engaging part is the engaged section provided by an engaging groove; and the engaging projection engages with the engaging groove.

10. The electronic device according to claim 9, wherein:

the case includes first to fourth walls defining the approximately rectangular tubular shape;

the first wall faces the second wall and the third wall faces the fourth wall;

each of the first wall and the second wall is larger than each of the third wall and the fourth wall; and each of the first wall and the second wall has the case-side fixing part and the case-side engaging part.

11. The electronic device according to claim 9, wherein:

the wall has a plurality of case-side fixing parts separating from each other; and the case-side engaging part is located between two of the plurality of case-side fixing parts.

12. The electronic device according to claim 9, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

13. An electronic device comprising:

a printed circuit board having an electronic element and a plurality of lands;

a case having an approximately rectangular tubular shape, wherein an end of the approximately rectangular tubular shape opens to provide an opening portion from which the printed circuit board is inserted into the case; and a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:

the case includes a wall having a case-side fixing part and a case-side engaging part at a portion adjacent to the opening portion;

the housing has a housing-side fixing part and a housing-side engaging part at a surface facing the wall of the case;

the case-side fixing part is one of a fixing projection and a fixing hole and the housing-side fixing part is the other one of the fixing projection and the fixing hole; the case-side fixing part engages with the housing-side fixing part for fixing the case and the housing to each other;

the case-side engaging part is one of an engaging projection and an engaged section and the housing-side engaging part is the other one of the engaging projection and the engaged section;

the case-side engaging part engages with the housing-side engaging part for restricting the portion of the case adjacent to the opening portion from separating from the housing;

the wall has a plurality of case-side engaging parts separating from each other; and the case-side fixing part is located between two of the plurality of case-side engaging parts.

14. The electronic device according to claim 13, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

15. The electronic device according to claim 13, wherein:

the case-side fixing part is located at a middle portion of the wall in a direction approximately perpendicular to the inserting direction of the printed circuit board; and the two of the plurality of case-side engaging parts are located to be in line symmetry with respect to the case-side fixing part.

16. The electronic device according to claim 15, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

17. An electronic device comprising:

a printed circuit board having an electronic element and a plurality of lands;

a case having an approximately rectangular tubular shape, wherein an end of the approximately rectangular tubular shape opens to provide an opening portion from which the printed circuit board is inserted into the case; and a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:

the case includes a wall having a case-side fixing part and a case-side engaging part at a portion adjacent to the opening portion;

the housing has a housing-side fixing part and a housing-side engaging part at a surface facing the wall of the case;

the case-side fixing part is one of a fixing projection and a fixing hole and the housing-side fixing part is the other one of the fixing projection and the fixing hole;

the case-side fixing part engages with the housing- side fixing part for fixing the case and the housing to each other;

the case-side engaging part is one of an engaging projection and an engaged section and the housing-side engaging part is the other one of the engaging projection and the engaged section;

the case-side engaging part engages with the housing-side engaging part for restricting the portion of the case adjacent to the opening portion from separating from the housing;

the housing has a plurality of separating walls so as to separate the plurality of terminals into a plurality of ports on the inner space side of the housing; and the housing-side fixing part and the housing-side engaging part are located on respective lines extended from the plurality of separating walls.

18. The electronic device according to claim 17, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

19. An electronic device comprising:

a printed circuit board having an electronic element and a plurality of lands;

a case having an approximately rectangular tubular shape, wherein an end of the approximately rectangular tubular shape opens to provide an opening portion from which the printed circuit board is inserted into the case; and a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:

the case includes a wall having a case-side fixing part and a case-side engaging part at a portion adjacent to the opening portion;

the housing has a housing-side fixing part and a housing-side engaging part at a surface facing the wall of the case;

the case-side fixing part is one of a fixing projection and a fixing hole and the housing-side fixing part is the other one of the fixing projection and the fixing hole;

the case-side fixing part engages with the housing-side fixing part for fixing the case and the housing to each other;

the case-side engaging part is one of an engaging projection and an engaged section and the housing-side engaging part is the other one of the engaging projection and the engaged section;

the case-side engaging part engages with the housing-side engaging part for restricting the portion of the case adjacent to the opening portion from separating from the housing; and each of the case-side fixing part and the housing-side fixing part has a width decreasing toward an opposite side of the opening portion in the inserting direction of the printed circuit board.

20. The electronic device according to claim 19, wherein:
the case has a contact portion on an inner surface thereof;
the housing has an extended surface from which the one end portion of each of the plurality of terminals extends toward the corresponding land; and
the contact portion is in contact with two longitudinal end portions of the extended surface in a state where the case-side fixing part engages with the housing-side fixing part.

21. An electronic device comprising:
a printed circuit board having an electronic element and a plurality of lands;
a case having an approximately rectangular tubular shape, wherein an end of the approximately rectangular tubular shape opens to provide an opening portion from which the printed circuit board is inserted into the case; and
a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:
the case includes a wall having a case-side fixing part and a case-side engaging part at a portion adjacent to the opening portion;
the housing has a housing-side fixing part and a housing-side engaging part at a surface facing the wall of the case;
the case-side fixing part is one of a fixing projection and a fixing hole and the housing-side fixing part is the other one of the fixing projection and the fixing hole; the case-side fixing part engages with the housing-side fixing part for fixing the case and the housing to each other;
the case-side engaging part is one of an engaging projection and an engaged section and the housing-side engaging part is the other one of the engaging projection and the engaged section;
the case-side engaging part engages with the housing side engaging part for restricting the portion of the case adjacent to the opening portion from separating from the housing; and
one of the case-side fixing part and the housing-side fixing part is configured to have a spring section.

22. The electronic device according to claim 21, wherein:
the case has a contact portion on an inner surface thereof;
the housing has an extended surface from which the one end portion of each of the plurality of terminals extends toward the corresponding land; and
the contact portion is in contact with two longitudinal end portions of the extended surface in a state where the case-side fixing part engages with the housing-side fixing part.

23. An electronic device comprising:
a printed circuit board having an electronic element and a plurality of lands;
a case having an approximately rectangular tubular shape, wherein an end of the approximately rectangular tubular shape opens to provide an opening portion from which the printed circuit board is inserted into the case; and
a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:
the case includes a wall having a case-side fixing part and a case-side engaging part at a portion adjacent to the opening portion;
the housing has a housing-side fixing part and a housing-side engaging part at a surface facing the wall of the case;
the case-side fixing part is one of a fixing projection and a fixing hole and the housing-side fixing part is the other one of the fixing projection and the fixing hole;
the case-side fixing part engages with the housing-side fixing part for fixing the case and the housing to each other;
the case-side engaging part is one of an engaging projection and an engaged section and the housing-side engaging part is the other one of the engaging projection and the engaged section;
the case-side engaging part engages with the housing-side engaging part for restricting the portion of the case adjacent to the opening portion from separating from the housing;
one of the case and the housing has a lifting projection adjacent to the opening portion;
the lifting projection is located on an opposite side of the case-side engaging part and the housing-side engaging part from the case-side fixing part and the housing-side fixing part;
the lifting projection has a first projecting height; the engaging projection has a second projecting height; and
the first projecting height is less than the second projecting height.

24. The electronic device according to claim 23, wherein:
the case has a contact portion on an inner surface thereof;
the housing has an extended surface from which the one end portion of each of the plurality of terminals extends toward the corresponding land; and
the contact portion is in contact with two longitudinal end portions of the extended surface in a state where the case-side fixing part engages with the housing-side fixing part.

25. The electronic device according to claim 23, wherein:
the case has a rear wall on an opposite side of the opening portion;
the lifting projecting has an end on the rear wall side;
the end of the lifting projection is located a first distance from the rear wall;
the engaging projection has an end on the rear wall side;
the end of the engaging projection is located a second distance from the rear wall; and
the first distance is larger than the second distance.

26. The electronic device according to claim 25, wherein:
the case has a contact portion on an inner surface thereof;
the housing has an extended surface from which the one end portion of each of the plurality of terminals extends toward the corresponding land; and
the contact portion is in contact with two longitudinal end portions of the extended surface in a state where the case-side fixing part engages with the housing-side fixing part.

27. An electronic device comprising:
a printed circuit board having an electronic element and a plurality of lands;

a case having an approximately rectangular tubular shape, wherein an end of the approximately rectangular tubular shape opens to provide an opening portion from which the printed circuit board is inserted into the case; and a connector including a housing and a plurality of terminals arranged in the housing, the housing covering the opening portion of the case and defining an inner space, each of the plurality of terminals having two end portions, one end portion of the each of the plurality of terminals extending from the housing and coupled with corresponding one of the plurality of lands, and the other end portion of the each of the plurality of terminals extending from the housing toward the inner space, wherein:

the case includes a wall having a case-side fixing part and a case-side engaging part at a portion adjacent to the opening portion;

the housing has a housing-side fixing part and a housing-side engaging part at a surface facing the wall of the case;

the case-side fixing part is one of a fixing projection and a fixing hole and the housing-side fixing part is the other one of the fixing projection and the fixing hole;

the case-side fixing part engages with the housing-side fixing part for fixing the case and the housing to each other;

the case-side engaging part is one of an engaging projection and an engaged section and the housing-side engaging part is the other one of the engaging projection and the engaged section;

the case-side engaging part engages with the housing-side engaging part for restricting the portion of the case adjacent to the opening portion from separating from the housing;

the case has an open edge that defines the opening portion;

the housing has a protruding portion; and a part of the open edge is in contact with the protruding portion in a state where the case-side fixing part engages with the housing-side fixing part.

28. The electronic device according to claim 27, wherein:

the case has a contact portion on an inner surface thereof;

the housing has an extended surface from which the one end portion of each of the plurality of terminals extends toward the corresponding land; and the contact portion is in contact with two longitudinal end portions of the extended surface in a state where the case-side fixing part engages with the housing-side fixing part.

* * * * *